United States Patent [19]

Hisano

[11] Patent Number: 5,070,331
[45] Date of Patent: Dec. 3, 1991

[54] HIGH RESOLUTION D/A CONVERTER OPERABLE WITH SINGLE SUPPLY VOLTAGE

[75] Inventor: Shinichi Hisano, Boston, Mass.

[73] Assignee: Analog Devices, Incorporated, Norwood, Mass.

[21] Appl. No.: 493,920

[22] Filed: Mar. 15, 1990

[51] Int. Cl.[5] .............................................. H03M 1/78
[52] U.S. Cl. ..................................... 341/154; 341/119
[58] Field of Search .......................... 341/119, 154, 153

[56] References Cited

U.S. PATENT DOCUMENTS

| | | | |
|---|---|---|---|
| 3,940,760 | 2/1976 | Brokaw | 341/119 |
| 3,961,926 | 6/1976 | Craven | 341/154 |
| 4,176,344 | 11/1979 | Saari et al. | 341/119 |
| 4,309,693 | 1/1982 | Craven | 341/154 |
| 4,349,811 | 9/1982 | Brokaw | 341/119 |
| 4,543,560 | 9/1985 | Holloway | 340/347 DA |
| 4,800,365 | 1/1989 | White et al. | 341/119 |
| 4,899,152 | 2/1990 | Barrow et al. | 341/154 |

Primary Examiner—J. R. Scott
Assistant Examiner—Marc S. Hoff
Attorney, Agent, or Firm—Parmelee, Bollinger & Bramblett

[57] ABSTRACT

A monolithic chip with an integrated circuit forming an 18-bit D/A converter powered by a single supply of +5 volts. The circuit includes a voltage reference producing two stable voltages of 3.5 V and 2.5 V which are directed to a control amplifier. This amplifier produces control signals for the current-source cells of a current-steering network utilizing a segmentation decoder for the three most significant bits, a collector-connected R/2R ladder for the intermediate bits, and an emitter-connected R/2R ladder for the remaining least significant bits. The control signals include one for setting the level of current through an NPN current-source transistor, a second for setting the level of current through a PMOS transistor for turning on or off a pair of switching transistors, and a third for establishing a bias voltage for the turn-on circuits for the NPN current-source transistor. An output operational amplifier has its inverting input connected to the output of the current-steering network and to a bipolar offset current circuit powered by the 3.5 V output of the voltage reference. The non-inverting input of the amplifier is connected to the 2.5 volt reference voltage to establish a pseudo-ground for the amplifier. A temperature-compensation circuit is provided for the emitter-connected R/2R ladder, and uses only NPN transistors without requiring any elements interfering with the operation of the current-source transistors, and without requiring an associated amplifier.

5 Claims, 7 Drawing Sheets

HIGH RESOLUTION D/A CONVERTER OPERABLE WITH SINGLE SUPPLY VOLTAGE

BACKGROUND OF THE INVENTION

1. Field of the Invention

This invention relates to digital-to-analog (D/A) converters. More particularly, this invention relates to such converters having a high resolution, such as 18 bits, and which yet are capable of operating from a single supply voltage.

2. Description of the Prior Art

D/A converters capable of 12-bit to 16-bit conversions are commonly available, and take various forms. One popular 12-bit converter, using individual current sources for each bit, is disclosed in U.S. Pat. No. 4,309,693 (Craven). A 16-bit converter using cascaded resistor strings is disclosed in U.S. Pat. No. 4,543,560 (Holloway).

For modern high-performance applications such as digital audio systems, it is desired to make still higher resolution conversions, up to at least 18 bits. Moreover, it is very important that such a converter be operable with a single supply voltage, such as 5 volts. The converter also must have very low distortion, and be capable of integration with all required functions on a single chip.

SUMMARY OF THE INVENTION

In a preferred embodiment of the invention, to be described hereinbelow in detail, a D/A converter is provided comprising a number of separate current sources which are controlled, as part of a current-steering network, by an 18-bit digital input signal. The converter further includes an on-board reference voltage generator the output of which is sub-divided to produce two stable reference voltages. These two voltages are directed to a control amplifier which develops control signals for setting the full-scale output current level of the current-steering network. These two voltages also are directed to an output operational amplifier for controlling the development of an output analog voltage responsive to the current from the steering network. The D/A converter further includes an R/2R network having a temperature-compensating termination circuit capable of operation with the low head-room available from a single supply of five volts.

Other objects, aspects and advantages of the invention will in part be pointed out in, and in part apparent from, the following description of a preferred embodiment of the invention, considered together with the accompanying drawings.

DESCRIPTION OF A PREFERRED EMBODIMENT

Figure 1:
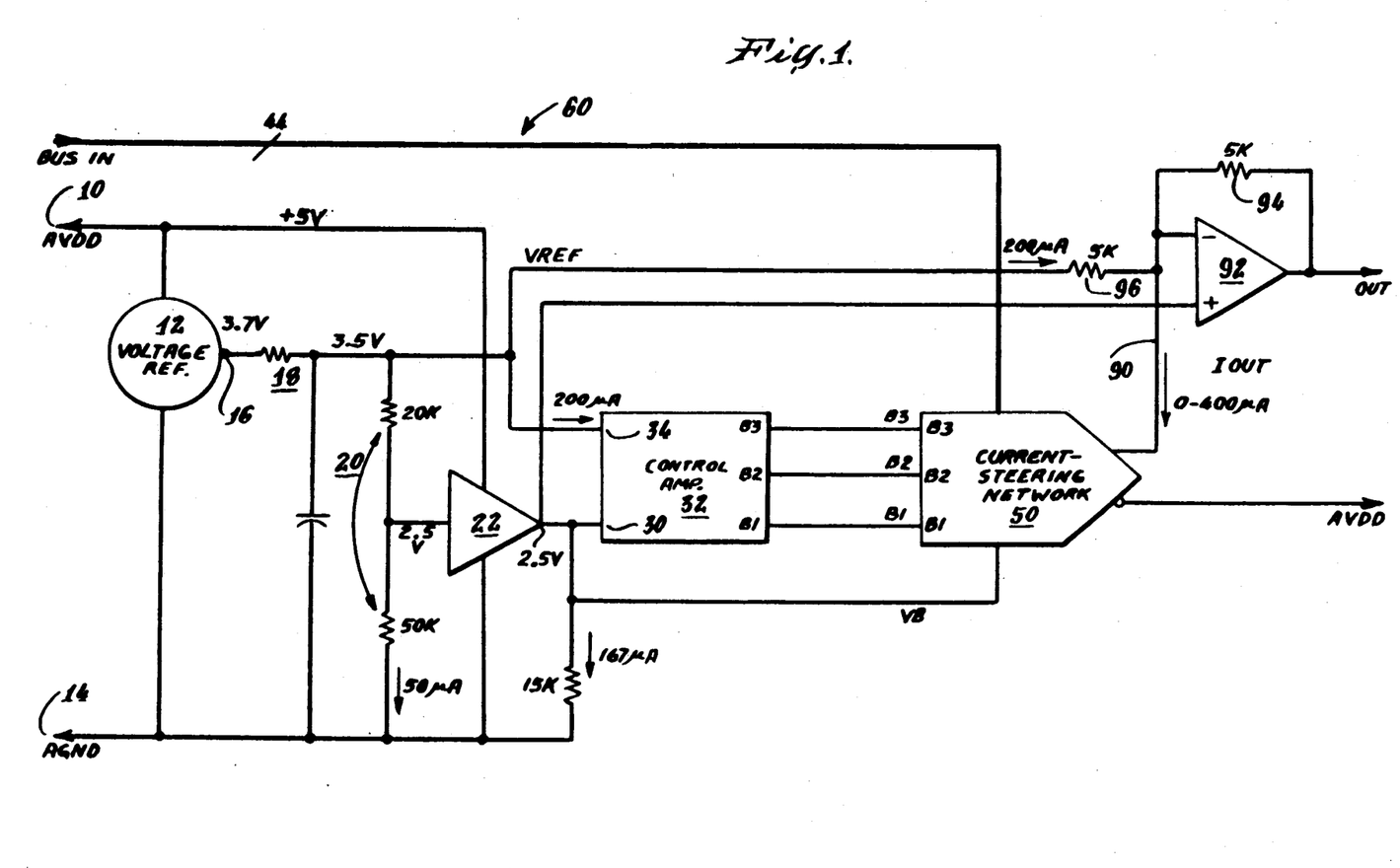
FIGURE 1 is a block diagram of a D/A converter in accordance with the invention.

Referring first to FIG. 1, the converter includes a supply terminal 10 which may for example be furnished with a supply voltage AVDD of +5 volts ±5%. A voltage reference 12 is connected between the AVDD line and a ground line 14 (AGND), and produces on its output terminal 16 a stable voltage of 3.7 volts. The voltage reference 12 may be of the band-gap type, of which there are a number of variants known in the art.

The 3.7 volt reference supply output is directed through an RC filter 18, which reduces the voltage to 3.5V. This voltage is further divided by a resistor network 20 to produce a second supply voltage of 2.5 volts. This is fed to a buffer amplifier 22 which replicates the 2.5 volt level at its output.

Figure 2:
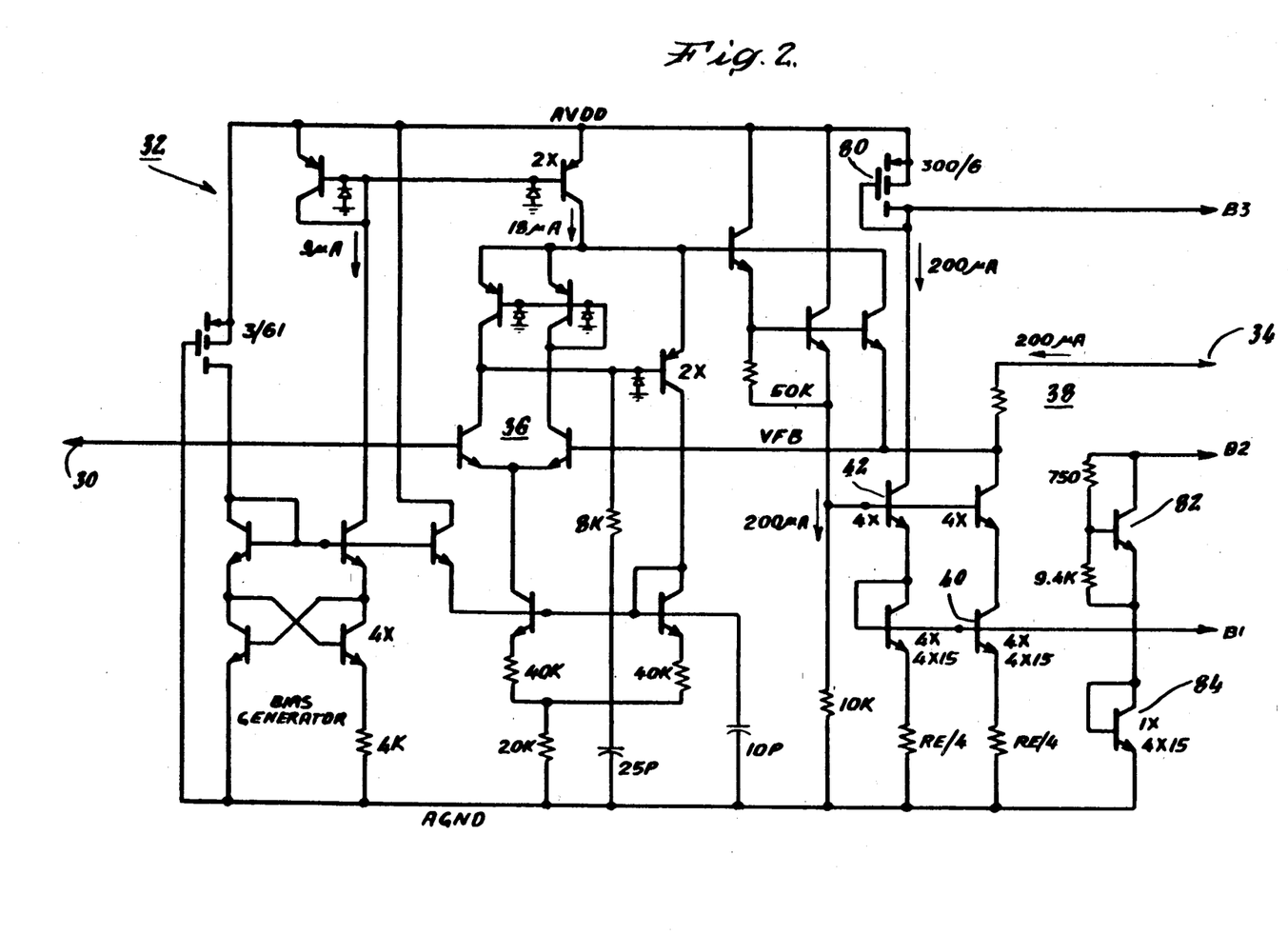
FIGURE 2 shows details of the control amplifier forming part of the converter of FIG. 1.

The 2.5 volt reference output of the buffer amplifier 22 is directed to one input terminal 30 of a control amplifier 32 which includes a second input terminal 34 to receive the 3.5 volt reference. FIG. 2 shows details of this control amplifier, from which it will be seen that the two reference voltages are directed to the respective inputs of a differential amplifier 36. Feedback and bias circuitry connected to this differential amplifier function in known ways to control the current from input terminal 34 to produce 2.5 volts at the lower end of a series-connected feedback resistor 38. The circuitry is so arranged that this voltage results in a current through the resistor of 200 μamps.

The current through the feedback resistor 38 is controlled by a transistor 40 the base of which is driven by the emitter of a transistor 42 operable by circuitry associated with the differential amplifier 36. The voltage on the base of transistor 40 is the principal output signal of the control amplifier 32, and appears at a node labelled B1. This output voltage is directed to a current-steering network generally indicated at 50 in FIG. 1, and shown in detail in FIGS. 3A–3C. The control amplifier output B1 is used to control the current output of a series of identical current sources 52, details of which are shown in FIG. 4.

Figure 3A:
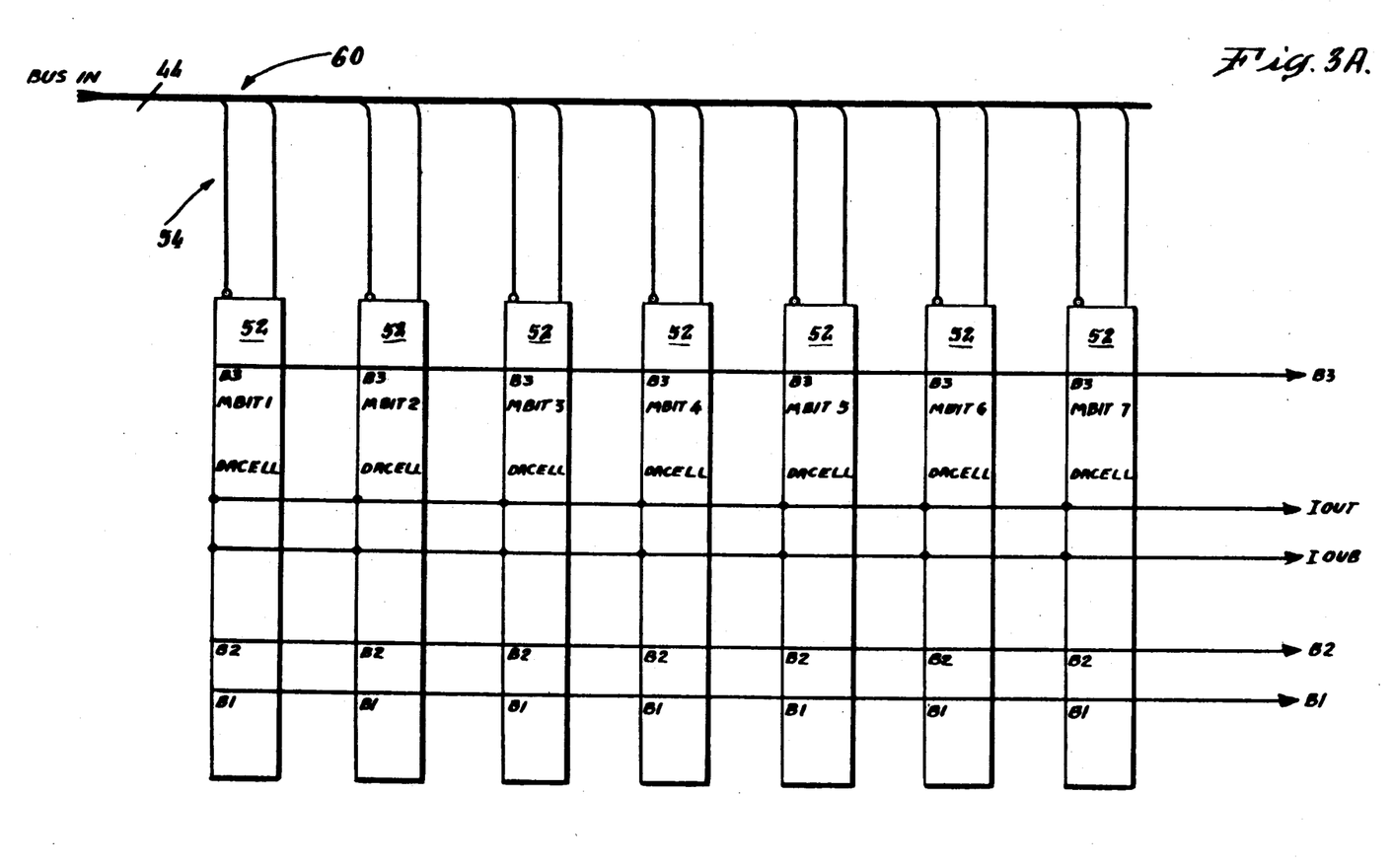
FIGS. 3A, 3B and 3C show interconnected portions of the current-steering network.
Figure 4:
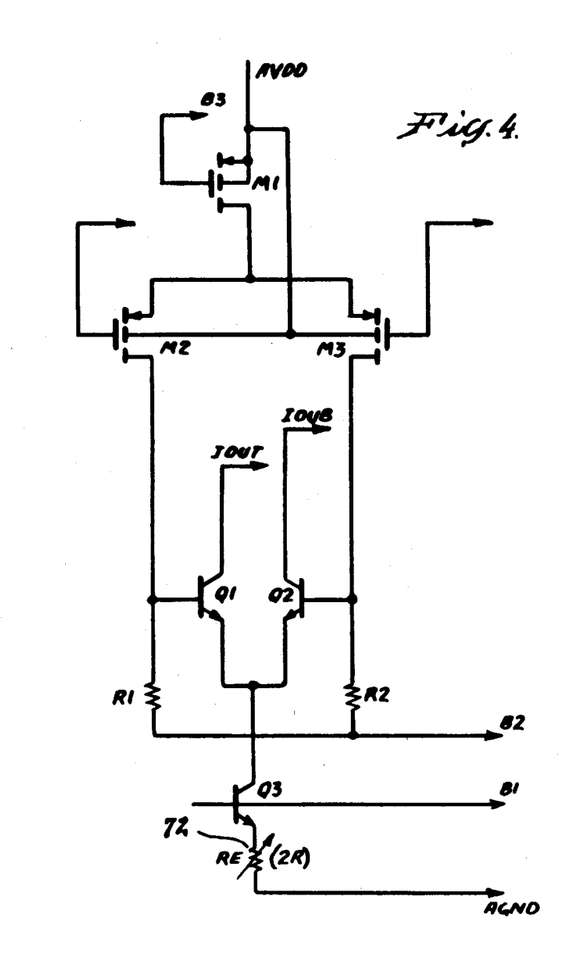
FIG. 4 shows details of the current-source cells used in the current-steering network.

Referring now to FIG. 3A, there is shown an. input bus 60 which has 44 lines arranged as 22 line pairs each carrying a set of complementary signals for controlling a corresponding current-source cell 52. The signals on the input bus are basically derived from the 18-bit converter input signal, which is stored in a register (not shown).

Figure 5:
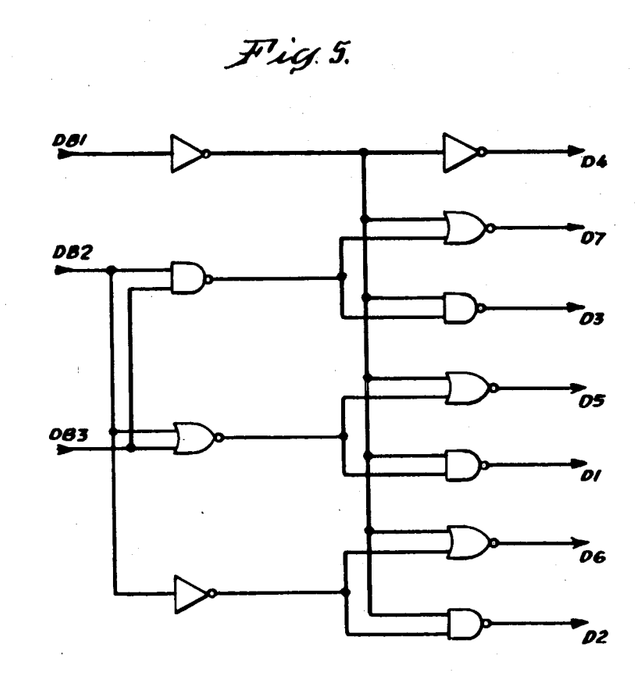
FIG. 5 is a circuit diagram of a 3 to 7 decoding circuit.

Seven of the current-source cells 52 are shown in FIG. 3A, and are controlled by the first three most significant bits (MSB) of the 18-bit input signal, in a segmentation arrangement using a thermometer decoder. More specifically, the first three data bits are supplied to a logic decoder (as shown in FIG. 5) which produces corresponding on/off signals for the seven current cells. These signals are developed as complementary signals to be supplied to the first seven line pairs 54. As the number represented by the first 3 bits advances from zero to seven, the first seven current cells are turned on progressively, each adding its current to that of the previously turned-on cell, with the outputs of all summed in an output current line IOUT.

Figure 3B:
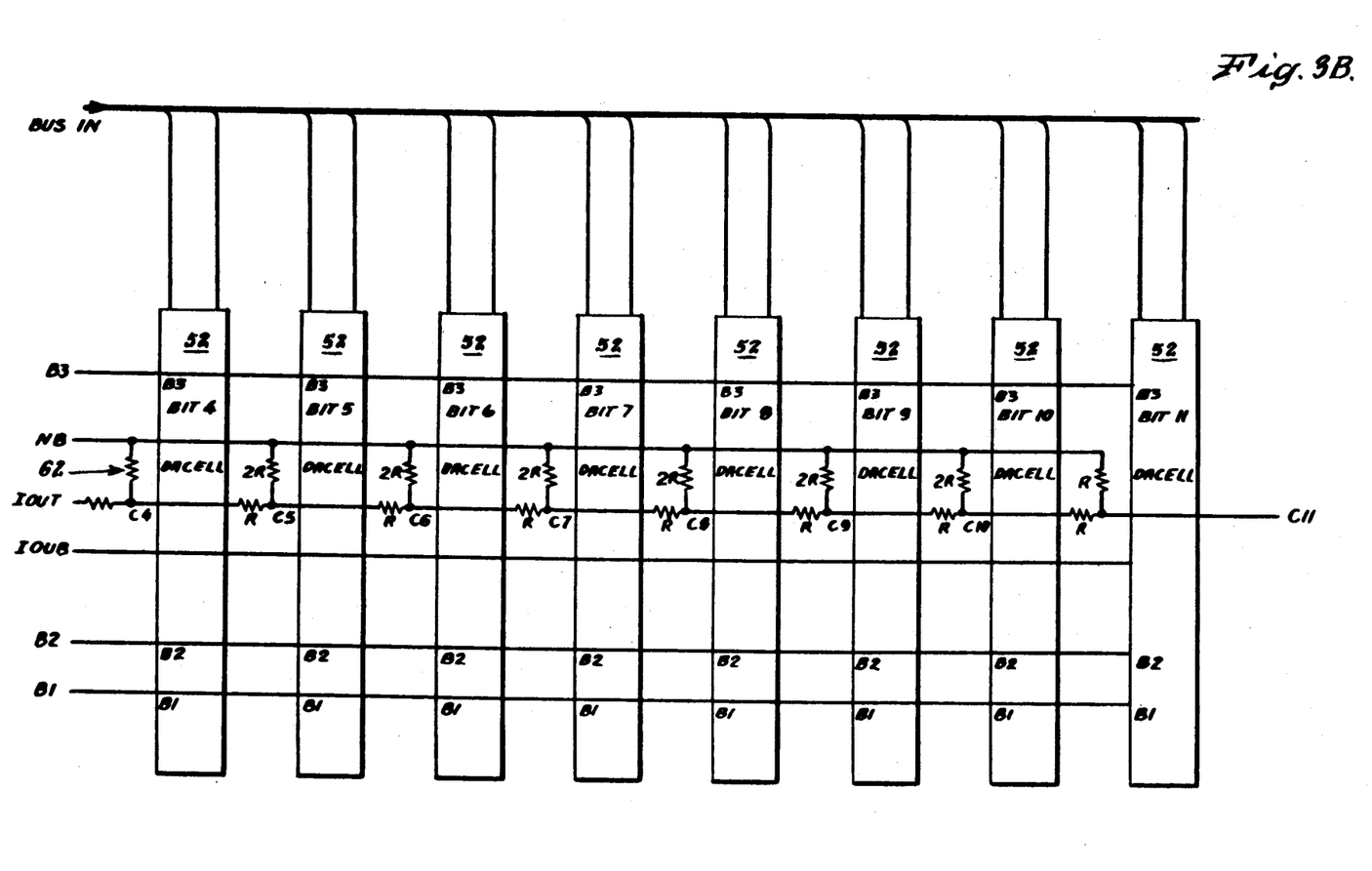
Figure 3C:
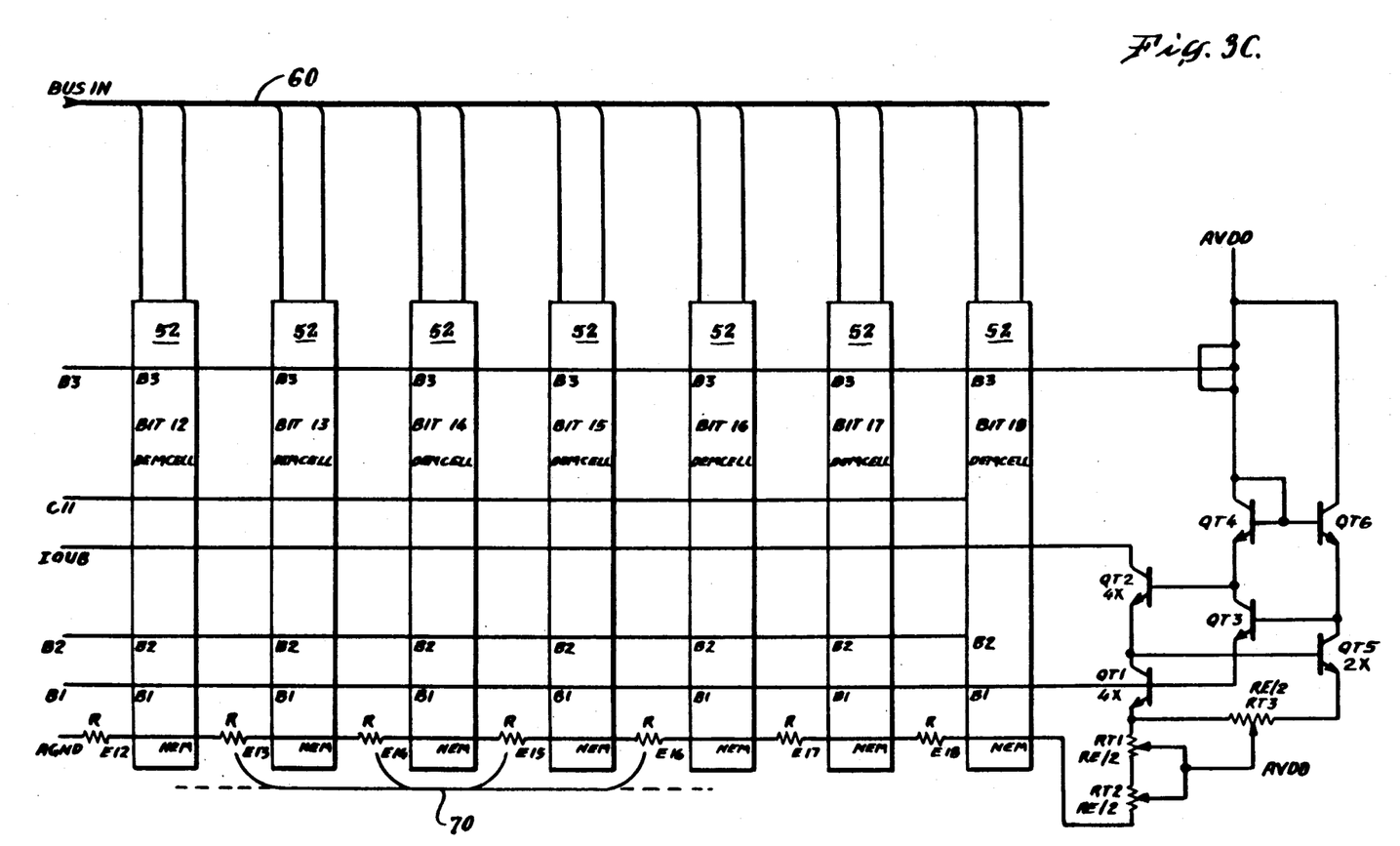

FIG. 3B shows the portion of the current-steering network 50 which supplies the current for the bits numbered 4–11. This portion employs an R/2R network 62 the nodes of which are coupled respectively through switching output transistors Q1 to the collectors of the current-source transistors Q3 of the corresponding current-source cells 52. FIG. 3C shows the final portion of the current-steering network which supplies the current for bits numbered 12-18. This portion includes a series-connected string of resistors 70 connected at the left-hand end to the AGND line. The nodes (NEM) between the resistors are connected to the AGND terminals of the corresponding current-source cells 52 (FIG. 4). The series resistors cooperate with the emitter resistors 72 of the current-source cells to form an R/2R network, inverted relative to the previously-described R/2R network 62 which is connected to the collectors of the switching output transistors Q rather than to the emitters of the current source transistors Q3. This arrangement produces binarily-weighted currents through the current-source cells for bits numbered 12-18. These currents are supplied from the collectors of the turned-on switching transistors Q1 to the output line C11 (see also FIG. 3B).

The current-source cell 52 shown in FIG. 4 is generally of the type known as a Craven cell (as shown in the above-mentioned U.S. Pat. No. 4,309,693), but with modifications. For example, PMOS transistors M1, M2 and M3 are used in the top half of the cell to set the currents through R1 and R2 to control the switching output transistors Q1 and Q2 in a complementary fashion. Each current cell for bits 1-11 produces a current of 50 μamps at the collector of the transistor (Q1 or Q2) which is turned on. The remaining current-source cells for bits 12-18 produce progressively smaller currents, in a binary-weighted pattern.

Referring again to FIG. 2, the control amplifier 32 produces a second output, labelled B3, which is connected to the gates of all of the current-cell PMOS transistors M1, as shown in FIG. 4. This output B3 is derived from another PMOS transistor 80 in the control amplifier and carrying a current of 200 μamps. The output B3 forces the current through each of the transistors M1 to be 15 μamps, due to the relative geometries of the transistors. Thus, M1 serves as a current source supplying its current to either M2 or M3, depending upon which has been turned on by the complementary control signals from the input bus 60.

The current from transistor M1 flows through either R1 or R2, and raises the voltage at the top of the activated resistor by the amount needed to turn on the corresponding current-source switching output transistor Q1 or Q2. The voltage at the bottom of the resistors R1, R2 is controlled by the output node B2 from the control amplifier 32. This node is connected to a circuit in that amplifier including transistors 82, 84 which accepts the return current from all of the M1 transistors of the current-source cells 52 (twenty-two in total), and develops an appropriate constant bias voltage at the lower end of the resistors R1 and R2.

Referring again to FIG. 1, the final output current of the current-steering network 50 flows through an output line 90, and has a magnitude within the range of 0-400 μamps. This output line is connected to the inverting input of an output operational amplifier 92 which is provided with a feedback resistor 94 (5K). The non-inverting input of the output amplifier 92 is connected to the output of the buffer amplifier 22 to provide a pseudo-ground level of 2.5 volts about which the amplifier operates. A bipolar offset current also is developed at the inverting input terminal by a connection through a resistor 96 (5K) to the 3.5 volt reference supply line. Since the voltage across this resistor will be one volt (because the inverting input will be driven to 2.5 volts by feedback), the bipolar offset current through the resistor will be 200 μamps.

If for example the steering network 50 produces an output of 200 μamps (mid-scale), there will be no current through the feedback resistor 94, and the DAC output will be 2.5 volts. At zero current output from the steering network, the DAC output will be 1.5 volts, and at full-scale current output, the DAC output will be 3.5 volts.

Figure 6:
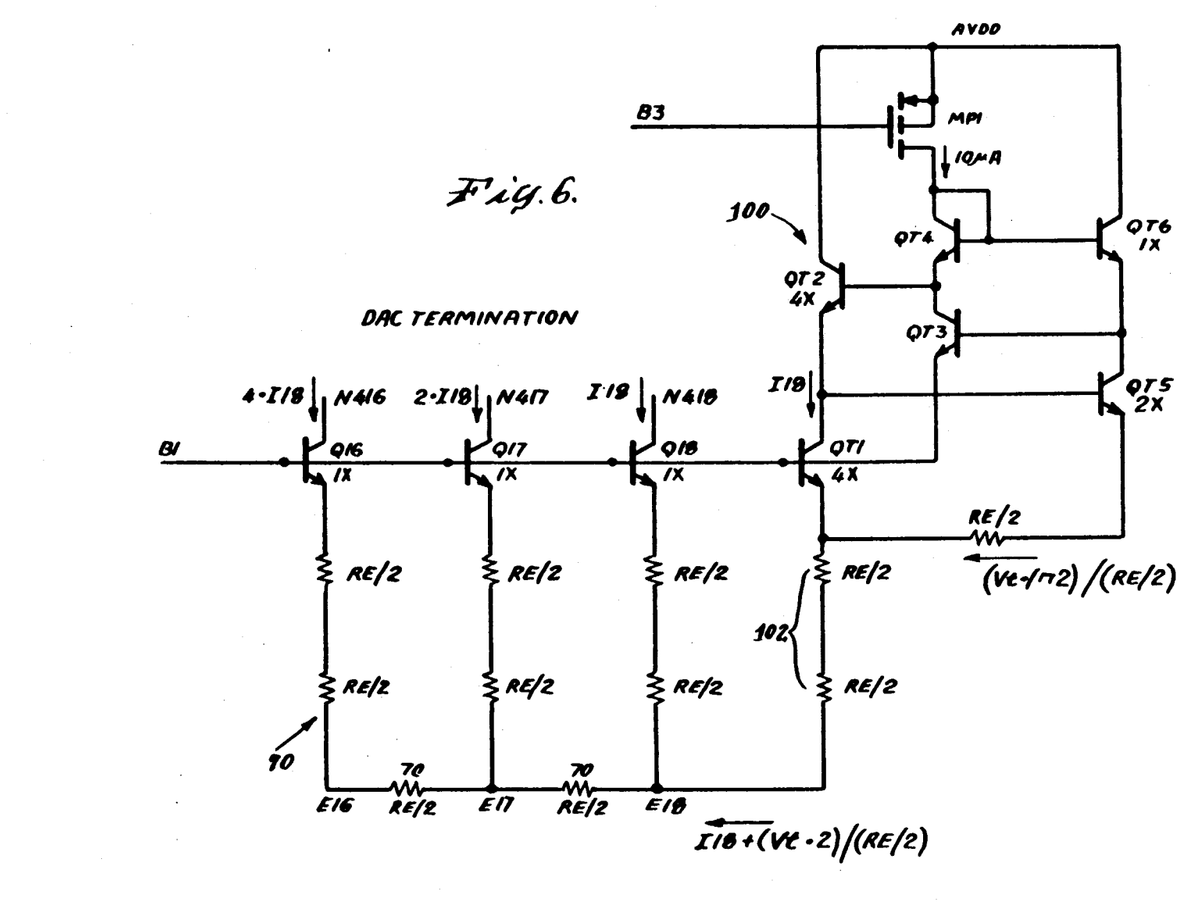
FIG. 6 shows a portion of an R/2R network with a termination circuit in accordance with the invention.

Referring now to FIG. 6, elements of the R/2R ladder comprising the series-connected resistors 70 are shown for the last three bits (numbered 16, 17 and 18). Improved temperature compensation circuitry also is shown at 100, including a network with bipolar transistors QT1-QT6 and a MOS current-source transistor MP1. This compensating circuitry is connected to the ladder terminating resistor 102 which, for proper ladder termination, has a value of 2R (referred to on the diagram as RE, comprising two RE/2 resistors in series).

As explained in U.S. Pat. No. 4,349,811 (Brokaw), temperature compensation for the current source transistors of a DAC using an R/2R ladder is achieved by fixing the voltage at the remote end of the termination resistor to a value of $2(kT/q)\ln 2$ (sometimes written as $2VT \cdot \ln 2$) greater than the voltage at the emitter of the current source transistor for the least significant bit (Q18, in this case). It is desirable that the compensating circuitry use transistors of the same polarity type (e.g., all NPN, or all PNP) to match the other circuitry of the converter. Also, for the present application, the compensating circuitry must avoid interference with the functioning of the current-source transistors, must operate within the headroom constraints of a single supply voltage, in this case 5 volts, and not require an amplifier. The circuit 100 to be described achieves these goals.

The compensating circuitry 100 includes a transistor QT1 connected to the common base line of the current source transistors Q18, etc., and has its emitter connected to the upper end of the termination resistor 102. The current I18 through QT1 is set to equal the current of the current source Q18, with the emitter area of QT1 fixed at four times that of Q18. An additional current for the termination resistor 102 is developed by QT5 and QT6, and has a magnitude of $VT \cdot \ln 2/(RE/2)$. This is due to the 2:1 emitter area ratio of QT5 to QT6. The magnitude of current from transistor MP1 is not critical, and is set at 10 μamps under control of B3 from the control amplifier 32 previously described.

With the net current through the termination resistor 102 set at $I18 + (VT \cdot \ln 2)/(RE/2)$, the voltage across the resistor will be $(I18)(RE) + 2VT \cdot \ln 2$. The voltage across the emitter resistor for current source Q18 will be simply $(I18)(RE)$. Subtracting these two voltages, the voltage difference between the top of the terminating resistor 102 and the emitter of Q18 will be $2VT \cdot \ln 2$, which provides the desired temperature compensation.

It should be noted that this is achieved by compensation circuitry utilizing only NPN bipolar transistors. It assures similar operating conditions for all of the current-source transistors. Also, no circuitry is required between the collector of Q18 and the output line, so that no headroom problems are created when this circuitry is powered with a single supply voltage of 5 volts.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. In a high-resolution digital-to-analog converter adapted to be powered by a single supply voltage, said converter including a plurality of NPN transistors serving as current sources and having equal emitter areas, means connecting the bases of said transistors together, an R-2R ladder network having series resistors of R and shunt resistors of 2R, with the shunt resistors thereof connected to respective current-source emitters to provide for binary weighting of the transistor currents, a 2R termination resistor connected to the nodal junction of the last shunt and series resistors at the least-significant bit end of said ladder, and circuit means for minimizing errors due to temperature-responsive changes in the offset voltages of said current-source transistors;

that improvement wherein said circuit means comprises means for developing through said termination resistor a current having two components, said means including:

a first additional NPN transistor having its base connected to the bases of said current-source transistors, and its emitter connected to the end of said 2R termination resistor which is remote from said nodal junction;

means for developing through said additional NPN transistor a first current component which flows through said termination resistor, said first current component having a magnitude equal to that of the current which flows through the least significant bit current-source transistor and through said last shunt resistor connected thereto; and second additional NPN transistor means coupled between said single supply voltage and said remote end of said 2R termination resistor to produce through said termination resistor a second current component equal to $(VT \cdot \ln 2)/R$;

whereby the voltage drop developed by said first current component flowing through said termination resistor is equal to the voltage drop developed by said least significant bit current flowing through said last shunt resistor, so that the potential at said remote end of said termination resistor is greater than the potential at the emitter end of said last shunt resistor by $2VT \cdot \ln 2$, thereby to effect proper temperature compensation.

2. A converter as in claim 1, wherein said first additional NPN transistor has an emitter area which is substantially four times as large as the emitter areas of said current-source transistors, to provide for equal currents through said first additional transistor and the least significant bit transistor.

3. A converter as in claim 1, wherein said second NPN transistor means includes two series transistors connected to said single supply voltage; and means connecting said remote end of said termination resistor to said series-connected transistors;

the emitter areas of said two series transistors being in the ratio of 2:1.

4. A converter as in claim 3, wherein said connecting means comprises a resistor having a resistance of R.

5. In a high-resolution digital-to-analog converter adapted to be powered by a single supply voltage, said converter including a plurality of bipolar transistors of one polarity serving as current sources and having equal emitter areas, means connecting the bases of said transistors together, an R-2R ladder network having series resistors of R and shunt resistors of 2R, with the shunt resistors thereof connected to respective current-source emitters to provide for binary weighting of the transistor currents, a 2R termination resistor connected to the nodal junction of the last shunt and series resistors at the least-significant bit end of said ladder, and circuit means for minimizing errors due to temperature-responsive changes in the offset voltages of said current-source transistors;

that improvement wherein said circuit means comprises means for developing through said termination resistor a current having two components, said means including:

a first additional bipolar transistor of said one polarity having tis base connected to the bases of said current-source transistors, and its emitter connected to the end of said 2R termination resistor which is remote from said nodal junction;

means for developing through said first additional transistor a first current component which flows through said termination resistor, said first current component having a magnitude equal to that of the current which flows through the least significant bit current-source transistor and through said last shunt resistor connected thereto; and second additional transistor means of said one polarity coupled between said single supply voltage and said remote end of said 2R termination resistor to produce through said termination resistor a second current component equal to $(VT \cdot \ln 2e)/R$;

whereby the voltage drop developed by said first current component flowing through said termination resistor is equal to the voltage drop developed by said least significant bit current flowing through said last shunt resistor, so that the potential at said remote end of said termination resistor differs from the potential at the emitter end of said last shunt resistor by $2VT \cdot \ln 2$, thereby to effect proper temperature compensation.

* * * * *